US 6,541,981 B2

(12) United States Patent
Allard, Jr. et al.

(10) Patent No.: US 6,541,981 B2
(45) Date of Patent: Apr. 1, 2003

(54) AUTOMATION OF TRANSMISSION LINE PULSE TESTING OF ELECTROSTATIC DISCHARGE DEVICES

(75) Inventors: Harvey C. Allard, Jr., Burlington, VT (US); Donald J. Cook, Essex Junction, VT (US); Robert J. Gauthier, Jr., Hinesburg, VT (US); Edward S. Hoyt, South Burlington, VT (US); Dain E. Reinhart, Fairfax, VT (US); John A. Watson, deceased, late of Burlington, VT (US), by Jane C. Eaton Watson, legal representative (73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/832,072

(22) Filed: Apr. 10, 2001

(65) Prior Publication Data
US 2002/0145432 A1 Oct. 10, 2002

(51) Int. Cl.⁷ .................. G01R 29/12; G01R 31/02; H02H 9/02; G06F 19/00
(52) U.S. Cl. .................. 324/458; 324/763; 361/93.2; 700/11; 702/120
(58) Field of Search ................. 324/458, 457, 324/763, 765, 710, 158.1; 361/1, 111, 93.2, 93.1, 91.1; 702/118, 119, 120, 121; 700/11, 22, 56, 121; 438/17

(56) References Cited

U.S. PATENT DOCUMENTS 4,775,640 A * 10/1988 Chan ................. 324/758
5,132,612 A      7/1992 Burns
5,201,415 A *  4/1993 Metz ................. 206/707
5,383,097 A *  1/1995 DeLucia et al. ....... 174/35 MS
5,491,427 A *  2/1996 Ueno et al. .......... 324/158.1
5,519,327 A *  5/1996 Consiglio ............ 324/602
5,523,699 A      6/1996 Miyagawa
5,644,249 A *  7/1997 Kister .............. 324/72.5
5,675,260 A * 10/1997 Consiglio ........... 324/158.1
5,804,977 A      9/1998 Consiglio
6,054,863 A *  4/2000 Morrison et al. ....... 324/537

FOREIGN PATENT DOCUMENTS

DE    4201022    9/1993
JP    63-257744  4/1990

OTHER PUBLICATIONS

IBM Technical Disclosure Bulletin, Micro Controller Program for Pseudo Random Electrostatic Discharge Pulse Generator, vol. 38, No. 01, Jan. 1995, pp. 431–434.

* cited by examiner

Primary Examiner—N. Le
Assistant Examiner—Anjan K. Deb
(74) Attorney, Agent, or Firm—Schmeiser, Olsen & Watts; Lawrence R. Fraley (57) ABSTRACT

A method and apparatus for automated testing of a plurality of electrostatic discharge (ESD) devices on a wafer. The wafer has M padsets and N conductive pads on each padset, where m is at least 1, and n is at least 2, and each ESD device is conductively coupled to a unique plurality of pads of a padset of the M padsets. Testing sequences, under program control of a computer system, implement the testing of the ESD devices.

43 Claims, 4 Drawing Sheets

AUTOMATION OF TRANSMISSION LINE PULSE TESTING OF ELECTROSTATIC DISCHARGE DEVICES

BACKGROUND OF THE INVENTION

1. Technical Field

The present invention relates to a method and apparatus for testing electrostatic discharge (ESD) devices on a wafer and more particularly to Automated Transmission Line Pulse testing of the ESD devices.

2. Related Art

Transmission Line Pulse (TLP) testing of electrostatic discharge (ESD) devices is performed by using a high-voltage power supply to charge a cable at a voltage level (V), followed by discharging the cable into the ESD device, and then measuring the current (I) through the ESD device. The preceding test may be repeated at successively increasing voltage levels, enabling an I vs. V curve to be generated until the device fails. In that manner, the TLP testing determines a current level at which the ESD device fails. Unfortunately, the aforementioned TLP testing is time consuming and costly.

A system and method is needed for reducing the time and cost of testing ESD devices.

SUMMARY OF THE INVENTION

The present invention provides an apparatus for testing a plurality of electrostatic discharge (ESD) devices on a wafer, comprising: a computer system; a pulse generator; a current probe; a switching matrix; an oscilloscope; a ground board; a voltage probe board; and N circuit paths originating from the switching matrix and passing through both the ground board and the voltage probe board, wherein N is at least 2, wherein the computer system is electrically coupled to electrical devices including: the pulse generator, the current probe, the switching matrix, the oscilloscope, the ground board, and the voltage probe board, wherein the computer system, upon execution of a computer code, serves to control and synchronize operation of the electrical devices, wherein, under program control of the computer system, the pulse generator serves to generate a voltage pulse and to send the voltage pulse to the switching matrix by way of the current probe, wherein, under program control of the computer system, the current probe serves to detect an electrical current value associated with the voltage pulse and to transmit the electrical current value to the oscilloscope, wherein, under program control of the computer system, the switching matrix serves to electrically connect Z circuit paths of the N circuit paths to the pulse generator, such that Z is at least 1, wherein, under program control of the computer system, the ground board serves to electrically disconnect X circuit paths of the Z circuit paths from the pulse generator and to connect the X circuit paths to a ground voltage level, wherein, under program control of the computer system and if X is less than Z, the voltage probe board serves to detect voltage values in a remaining Z-X circuit paths and to pass the voltage values to the oscilloscope, such that the remaining Z-X circuit paths of the Z circuit paths are not among the X circuit paths, and wherein the oscilloscope, under program control of the computer system, serves to receive the voltage values and the electrical current value and to pass the voltage values and the electrical current value to computer system.

The present invention provides an electronic structure utilized for enhancing an accuracy of voltage determinations made during testing of a plurality of electrostatic discharge (ESD) devices on a wafer, comprising:

the wafer having M padsets and N conductive pads on each padset, wherein M is at least 1, wherein N is at least 2, and wherein each ESD device is conductively coupled to a unique plurality of pads of a padset of the M padsets;

N circuit paths electrically coupled to the N conductive pads of a first padset of the M padsets; and an electrical device structure comprising a ground board in series with a voltage probe board, wherein the N circuit paths are electrically coupled to both the ground board and the voltage probe board, and wherein the voltage probe board and the ground board are each positioned no more than about 6 inches from the wafer.

The present invention provides a method for testing a plurality of electrostatic discharge (ESD) devices on a wafer, comprising the steps of:

providing an apparatus comprising: computer system; a pulse generator; a current probe; a switching matrix; an oscilloscope; a ground board; a voltage probe board; and N circuit paths originating from the switching matrix and passing through both the ground board and the voltage probe board, wherein N is at least 2, wherein the computer system is electrically coupled to electrical devices including: the pulse generator, the current probe, the switching matrix, the oscilloscope, the ground board, and the voltage probe board;

controlling and synchronizing, by the computer system upon execution of a computer code, operation of the electrical devices;

generating by the pulse generator, under program control of the computer system, a voltage pulse;

sending by the pulse generator, under program control of the computer system, the voltage pulse to the switching matrix by way of the current probe;

detecting by the current probe, under program control of the computer system, an electrical current value associated with the voltage pulse;

transmitting by the current probe, under program control of the computer system, the electrical current value to the oscilloscope;

electrically connecting by the switching matrix, under program control of the computer system, Z circuit paths of the N circuit paths to the pulse generator, such that Z is at least 1;

electrically disconnecting by the ground board, under program control of the computer system, X circuit paths of the Z circuit paths from the pulse generator;

connecting by the ground board, under program control of the computer system, the X circuit paths to a ground voltage level;

if X is less than Z, detecting voltage values by the voltage probe board, under program control of the computer system, a remaining Z-X circuit paths, such that the remaining Z-X circuit paths of the Z circuit paths are not among the X circuit paths;

passing by the voltage probe board, under program control of the computer system, the voltage values to the oscilloscope;

receiving by the oscilloscope, under program control of the computer system, the voltage values and the electrical current value; and passing by the oscilloscope, under program control of the computer system, the voltage values and the electrical current value to computer system.

The present invention provides a method for testing a plurality of electrostatic discharge (ESD) devices on a wafer, comprising the steps of:

providing the wafer having M padsets and N conductive pads on each padset, wherein M is at least 1, wherein N is at least 2, and wherein each ESD device is conductively coupled to a unique plurality of pads of a padset of the M padsets;

providing a computer system;

denoting the plurality of ESD devices as $E_1, E_2, \ldots, E_1$, wherein I denotes the number of said ESD devices;

sequencing, under program control of the computer system, the testing of the ESD devices $E_1, E_2, \ldots E_1$, wherein the testing of each ESD device of the ESD devices $E_1, E_2, E_1$ is under program control of the computer system.

The present invention provides a method for enhancing an accuracy of voltage determinations made during testing of a plurality of electrostatic discharge (ESD) devices on a wafer, comprising the steps of:

providing the wafer having M padsets and N conductive pads on each padset, wherein M is at least 1, wherein N is at least 2 and wherein each ESD device is conductively coupled to a unique plurality of pads of a padset of the M padsets;

providing N circuit paths electrically coupled to the N conductive pads of a first padset of the M padsets;

providing an electrical device structure comprising a ground board in series with a voltage probe board;

positioning the voltage probe board and the ground board such that the voltage probe board and the ground board are each positioned no more than about 6 inches from the wafer; and electrically coupling the N circuit paths to both the ground board and the voltage probe board.

The present invention provides a computer system for testing a plurality of electrostatic discharge (ESD) devices on a wafer, comprising:

a processor;

an input device coupled to the processor;

an output device coupled to the processor;

a first memory device coupled to the processor;

a computer code stored in the first memory device, wherein the processor executes the computer code, wherein the computer code comprises an algorithm which controls the testing of the plurality of ESD devices in the wafer, and wherein the algorithm implements an Automated Transmission Line Pulse (ATLP) testing of the ESD devices.

The present invention provides a computer program product, comprising: a computer usable medium having a computer readable program code embodied therein for testing a plurality of electrostatic discharge (ESD) devices on a wafer, wherein the computer readable program code includes an algorithm for implementing the testing by the Automated Transmission Line Pulse (ATLP) testing method.

The present invention provides a system and method which reduces the time and cost of testing ESD devices.

DETAILED DESCRIPTION OF THE INVENTION

Figure 1:
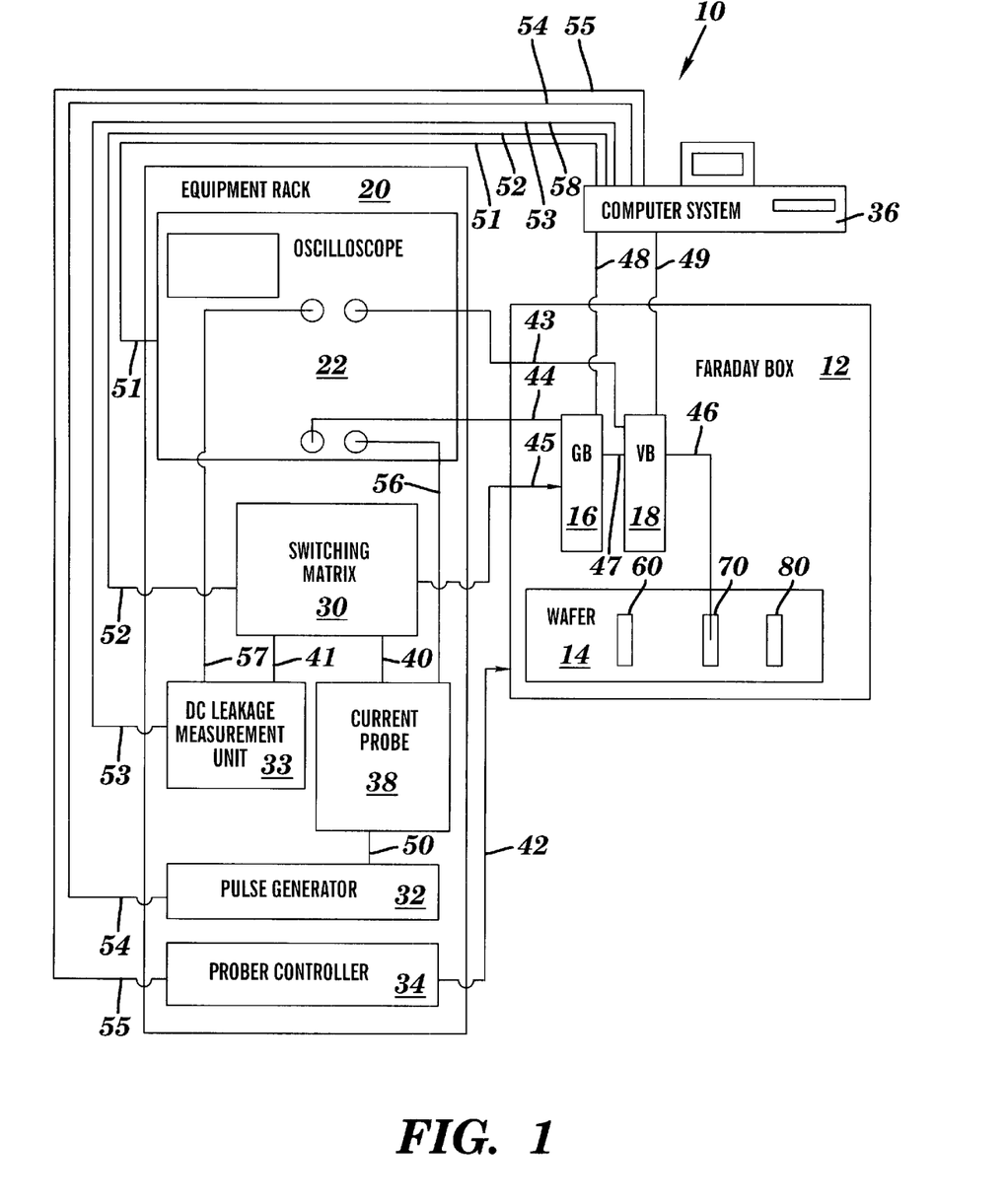
FIG. 1 lock diagram of an Automated Transmission Line Pulse (TLP) testing system for testing electrostatic discharge (ESD) devices on a wafer under control of a computer system, in accordance with embodiments of the present invention.

The present invention automates Transmission Line Pulse (TLP) testing of an electrostatic discharge (ESD) device. FIG. 1 is a schematic diagram of an Automated Transmission Line Pulse (ATLP) testing system 10, in accordance with embodiments of the present invention. The ATLP testing system 10 tests ESD devices on a wafer 14. The ESD devices generally include any semiconductor device such as, inter alia, resistors, MOSFETs, diodes, and silicon controlled rectifiers, etc. The ATLP testing system 10 includes a Faraday box 12, an equipment rack 20, a computer system 36, and electrically conductive couplers 40–57 (e.g., electrically conductive wiring) The Faraday box 12 includes, and shields from external electromagnetic radiation, the wafer 14, a voltage probe board (VB) 18, and a ground board (GB) 16. The testing rack 20 includes an oscilloscope 22, a switching matrix 30, a current probe 38, a pulse generator 32, a direct current (DC) leakage measurement unit 33, and a prober controller 34. The conductive couplers 40–57 each include conductive wiring or other conductive interfacing.

Figure 2:
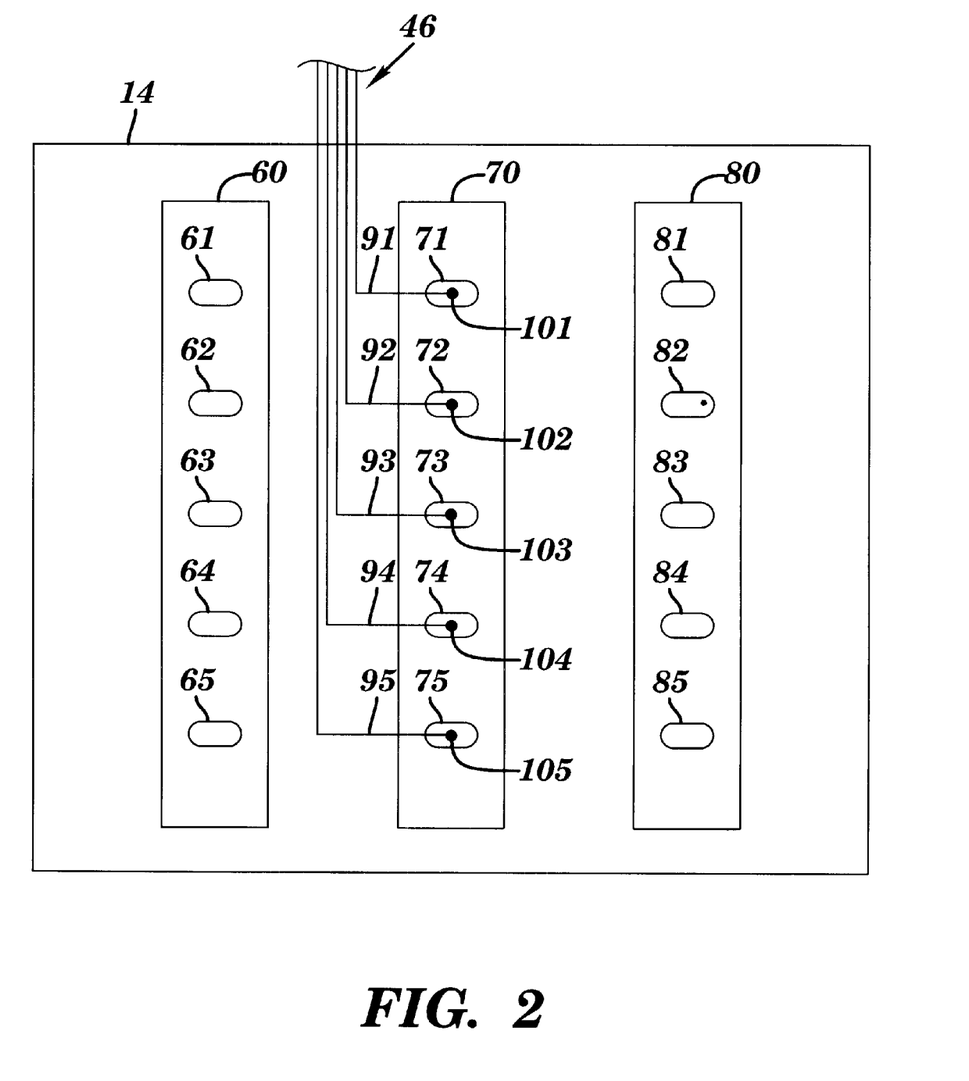
FIG. 2 depidcts the wafer of FIG. 1, showing padsets thereon.

The wafer 14 represents any substrate that includes ESD devices, such as, inter alia, an integrated circuit or a module. The wafer 14 includes padsets 60, 70, and 80, which are shown in more detail in FIG. 2. As shown in FIG. 2, the padset 60 comprises electrically conductive pads 61–65, the padset 70 comprises electrically conductive pads 71–75, and the padset 80 comprises electrically conductive pads 81–85. Each such conductive pad is electrically coupled to a terminal of an ESD device. For example, a first resistor may have two terminals which are electrically coupled to the pads 71 and 72 of the padset 70, and a second resistor may have two terminals which are electrically coupled to pads 74 and 75 of the padset 70. As another example, a MOSFET may have 4 terminals which are electrically coupled to pads 81–84 of the padset 80.

Generally, the wafer 14 has M padsets and each padset has N electrically conductive pads wherein $M \geq 1$, $N \geq 2$, and a plurality of ESD devices are electrically coupled to the N×M pads. As an example, FIG. 2 shows three padsets (M=3) with five pads in each padset (N=5). FIG. 2 shows the padsets 60, 70, and 80 as one-dimensional in a column format (i.e., 1×5). A padset generally may be either one-dimensional or two-dimensional. For example, a padset having 16 pads (i.e., N=16) may have any of the following formats: 1×16, 2×8, 4×4, 8×2, and 16×1. The N pads on a first padset of the M padsets may be in the same format or in a different format as compared with the N pads on a second padset of the M padsets. Additionally, different allocations of a fixed number of pads on the wafer 14 are possible. For example, various ways of allocating 100 pads on the wafer 14 include: M=1 and N=100, M=2 and N=50, M=4 and N=25, M=5 and N=20, M=10 and N=10, M=20, and N=5, M=25 and N=4, M=50 and N=2.

Also shown in FIG. 2 is the conductive coupler 46 electrically coupled to the padset 70. The conductive coupler 46 includes conductive wires 91–95 respectively ending in the conductive needles 101–105. Thus the conductive wires 91–95 are electrically coupled to the pads 71–75 by electrical contact between the conductive needles 101–105 and the pads 71–75, respectively. The conductive needles 101–105 are conductive contacts of any kind and may have any shape or geometry. A conductive needle does not necessarily have the shape of a conventional "needle." A conductive needle includes a conductive material such as, inter alia, tungsten carbide. Noting that each pad may be electrically coupled to a terminal of an ESD device, ATLP testing of the ESD device requires that conductive needles be in conductive contact with the particular pads which are electrically coupled to the ESD device.

Generally, the conductive coupler 46 includes N conductive wires corresponding to the N conductive pads of each padset. Each such conductive wire terminates in a conductive needle. Thus, the N conductive wires collectively include N conductive needles. The N conductive needles are arranged in a geometrical pattern which permits the N conductive needles to be aligned with the N pads of each padset, such that the N conductive needles may electrically contact the N pads of each padset.

Given the N pads on each of the M padsets on the wafer 14, the present invention automates testing of the ESD devices which are electrically coupled to the N×M pads. The automation includes having the computer system 36, through a computer code, manage and control: 1) the sequential order of testing the ESD devices, and 2) the sequence of operations or steps for testing each ESD device, as discussed infra in conjunction with FIG. 3. See FIG. 4 and accompanying discussion infra for the computer code 67 in the computer system 36. Execution of the computer code 67 enables the computer system 36 to control all devices in the ATLP test system 10.

Returning to FIG. 1, the computer system 36 controls the ATLP testing. The computer system 36 is electrically coupled to the voltage probe board 18 by the conductive coupler 49 which includes conductive wiring. The computer system 36 is electrically coupled to the ground board 16 by the conductive wire 48 which includes conductive wiring. The computer system 36 is electrically coupled to the oscilloscope 22 by the conductive coupler 51 which includes conductive wiring. The computer system 36 is electrically coupled to the switching matrix 30 by the conductive coupler 52 which includes conductive wiring. The computer system 36 is electrically coupled to the DC leakage measurement unit 33 by the conductive coupler 53 which includes conductive wiring. The computer system 36 is electrically coupled to the pulse generator 32 by the conductive coupler 54 which includes conductive wiring. The computer system 36 is electrically coupled to the prober controller 34 by the conductive coupler 55 which includes conductive wiring. The computer system 36 controls and synchronizes operation of the following devices by execution of the computer code 67 (see FIG. 4) in conjunction with the aforementioned conductive couplers in FIG. 1: the voltage probe board 18, the ground board 16, the oscilloscope 22, the switching matrix 30, the DC leakage measurement unit 33, the current probe 38, the pulse generator 32, and the prober controller 34.

There are N electrical circuit paths from the switching matrix 30 to the padset 70 of the wafer 14. If the N circuit paths are denoted as $C_1, C_2, \ldots, C_N$, and if the N pads of the padset 70 are denoted as $P_1, P_2, \ldots P_N$, then the circuit path $C_1$, begins at the switching matrix 30 and terminates at the pad $P_1$, (i=1,2, ..., N). For the example of FIG. 2 with N=5, the pads of the padset 70 are: $P_1$=71, $P_2$=72, $P_3$=73, $P_4$=74, $P_5$=75, and the circuit paths $C_1, C_2, C_3, C_4,$ and $C_5$, respectively include the conductive wiring 91, 92, 93, 94, and 95.

Each circuit path $C_1$ (i=1,2, ..., N) comprises the following devices in series: the conductive coupler 45, the ground board 16, the conductive coupler 47, the voltage probe board 18, and the conductive coupler 46. The positions of the ground board 16 and the voltage probe board 18 may be interchanged. The conductive couplers 45, 47, and 46 each comprise N sets of conductive wiring with each set of conductive wiring corresponding to one of the circuit paths $C_1, C_2, \ldots, C_N$. The conductive coupler 45 comprises N sets of conductive wiring between the switching matrix 30 and the ground board 16. The conductive coupler 47 comprises N sets of conductive wiring between the ground board 16 and the voltage probe board 18. The conductive coupler 46 comprises N sets of conductive wiring between the voltage probe board 18 and the padset 70.

To test a given ESD device which is electrically coupled to the padset 70, the pulse generator 32 generates a voltage pulse which is intended for transmission to one or more of the pads $P_1, P_2, \ldots P_N$ of the padset 70, wherein the one or more pads are electrically coupled to the given ESD device. Transmitting (or sending, passing, etc.) the voltage pulse means transmitting (or sending, passing, etc.) the electrical current which accompanies (i.e., is associated with) the voltage pulse. The pulse generator 32 includes any electronic device which generates voltage pulses and may include, inter alia, a charged cable. The voltage pulse intended for transmission to said one or more pads simulates a voltage discharge from a human body. Although a representative voltage discharge from a human body is a decaying exponential, the pulse generator 32 may generate a square wave such that the energy of the square wave is comparable to (i.e., within about 10% of) the energy of the decaying exponential. Other characteristics of the pulse generated by the pulse generator 32 may include: rise times less than 10 nanoseconds and pulse widths of an order of 100 nanoseconds. The preceding numerical values of rise time and pulse width are intended to be illustrative and are not intended to restrict the scope of rise time and pulse width for the present invention.

Under program control of the computer system 36 (i.e., using the computer code 67 shown in FIG. 4) through the conductive coupler 54, the pulse generator 32 transmits the voltage pulse (through the conductive coupler 50) through the current probe 38 to the switching matrix 30. The current probe 38 detects the total electrical current associated with the voltage pulse generated by the pulse generator 32 and passes the total electrical current value to the oscilloscope 22 through the conductive coupler 56. The oscilloscope 22 passes the total electrical current value to the computer system 36 through the conductive coupler 51 and may also display the current value.

The switching matrix 30 has switching hardware which may "switch in" (i.e., electrically couple to the pulse generator 32) any subset of the circuit paths $C_1, C_2, \ldots, C_N$. Under program control of the computer system 36 through the conductive coupler 52, the switching matrix 30 switches in the one or more circuit paths which are electrically coupled to the given ESD device to be tested. For example, if the given ESD device is a given resistor, and if pads 71 and 72 of the padset 70 in FIG. 2 are electrically coupled to the given resistor, then the switching matrix 30 would switch in (i.e., electrically couple to the pulse generator 32) two circuit paths: one terminating in the pad 71 and the other terminating in the pad 72. Each of the two circuit paths pass through the ground board 16 and the voltage probe board 18.

The ground board 16 grounds portions of the circuitry used for testing the given ESD device. The ground board has switching hardware which couples any subset of the circuit paths $C_1, C_2, \ldots, C_N$ to a ground voltage level ("ground plane") and electrically decouples each circuit path of said subset from the pulse generator 32. Thus, if the circuit path 72 is required to be grounded in the preceding example with the given resistor, then (under program control of the computer system 36 through the conductive coupler 48) the circuit path 72 is switched within the ground board 16 to a ground voltage level and is electrically decoupled from the switching matrix 30 at the ground board 16. Generally, the computer system 36, through the conductive coupler 48, can effectuate a switching to ground, and an electrical decoupling from the switching matrix 30 at the ground board 16, of any subset of the circuit paths $C_1, C_2, \ldots, C_N$.

Based on the preceding discussion, an ESD device may be "enabled" or "disabled." An ESD device is enabled if: all of the circuit paths associated with the ESD device ("ESD circuit paths") have been switched in (i.e., electrically coupled to the pulse generator 32) by the switching matrix 30; the subset of the ESD circuit paths which need to be grounded have indeed been grounded at the ground board 16 and electrically decoupled from the switching matrix 30 at the ground board 16; and the conductive needles of the conductive coupler 46 have placed in electrically conductive contact with the pads to which the ESD device is electrically coupled. The ESD device is disabled if: the associated ESD circuit paths have been switched out (i.e., electrically decoupled from the pulse generator 32) by the switching matrix 30; and all of the ESD circuit paths have been electrically decoupled from ground at the ground board 16 and electrically coupled to the switching matrix 30 at the ground board 16.

The voltage pulse passes through the ground board 16 en route to the ESD device. Under program control of the computer system 36 through the conductive coupler 48, the ground board 16 detects voltage values in grounded circuit paths and passes the voltage values to the oscilloscope 22 through the conductive coupler 44. The oscilloscope 22 passes the voltage values to the computer system 36 through the conductive coupler 51 and may also display the voltage values. Although the voltage levels at ground are theoretically zero volts, the voltages in the grounded circuit paths reflect noise (e.g., noise of the order of several millivolts). The voltage levels at ground are passed to the oscilloscope 22 as an error check to ensure that voltage levels do not exceed expected noise levels.

The voltage pulse passes through the voltage probe board 18 en route to the ESD device. Under program control of the computer system 36 through the conductive coupler 49, the voltage probe board 18 detects voltage values in the one or more circuit paths which are electrically coupled to the given ESD device by the switching matrix 30, and passes the voltage values to the oscilloscope 22 through the conductive coupler 43. The oscilloscope 22 passes the voltage values to the computer system 36 through the conductive coupler 51 and may also display the voltage values.

Operation of the switching matrix 30, the, ground board 16, and the voltage probe board 18 in relation the M padsets of the wafer 14 and to the N circuit paths is summarized as follows. As stated supra, the N circuit paths, if not electrically disconnected, extend from the switching matrix 30 to the N pads of a particular padset of the M padsets of the wafer 14. When an ESD device to be tested is electrically connected to Z pads of the N pads of the particular padset, the switching matrix 30, under program control of the computer system 36, electrically connects Z circuit paths of the N circuit paths to the pulse generator 32, wherein the Z circuit paths are electrically connected to the Z pads. Z is at least 1. However, X circuit paths of the Z circuit paths need to be electrically grounded. Accordingly, under program control of the computer system 36, the ground board 16 electrically both disconnects the X circuit paths from the pulse generator 32 and connects the X circuit paths to a ground voltage level. Additionally, under program control of the computer system 36 and if X is less than Z, the voltage probe board 18 detects voltage values in a remaining Z-X circuit paths of the Z circuit paths and passes the voltage values to the oscilloscope 22, such that the remaining Z-X circuit paths are not among the X circuit paths.

For example, assume that N=25 and the ESD device to be tested is a MOSFET having 4 terminals to be connected to 4 pads of a padset. Also assume that 1 of the 4 terminals of the MOSFET is to be electrically grounded. Then Z=4, X=1, and Z-X=3. Thus, the switching matrix 30 electrically connects 4 circuit paths of the 25 circuit paths to the pulse generator 32, wherein the 4 circuit paths thus connected and the 4 terminals of the MOSFET are electrically connected to the same 4 pads of the padset. The ground board 16 both electrically disconnects the 1 circuit paths of the 4 circuit paths from the pulse generator 32 and electrically connects the 1 circuit path to a ground voltage level. Additionally, under program control of the computer system 36, the voltage probe board 18 detects voltage values in a remaining 3 circuit paths of the 4 circuit paths and passes the voltage values to the oscilloscope 22.

As explained supra, the oscilloscope 22 receives and passes both electrical current values and voltage values to the computer system 36 through the conductive coupler 51. The oscilloscope 22 may be a conventional oscilloscope, but is generally any electronic device 5 capable of receiving current and voltage values and passing the current and voltage values to the computer system 36 through the conductive coupler 51. As stated supra, the conductive coupler 51 comprises conductive lines.

The voltage values passed from the ground board 16 and the voltage probe board 18 to the oscilloscope 22 are not precisely the same as the corresponding voltages at pads of the padset 70, because of voltage drops over the conductive couplers 46 and 47. In order to minimize, and keep to acceptable levels, the voltage drops over the conductive couplers 46 and 47, the ground board 16 and the voltage probe board 18 should each be no more than about 6 inches from the wafer 14. Additionally, the ground board 16 should be separated from the voltage probe board 18 by no more than about six inches. Thus, the close proximity of the ground board 16 and the voltage probe board 18 to the wafer 14 enhances an accuracy of voltage determinations at pads of the padset 70, wherein such voltage determinations are based on the voltage values passed from the ground board 16 and the voltage probe board 18 to the oscilloscope 22.

While the preceding discussion related to transmitting a voltage pulse from the pulse generator 32 to pads on the padset 70 of the wafer 14, transmitting a voltage pulse to another padset on the wafer 14 requires that the conductive coupler 46 be moved to the other padset. Under program control of the computer system 36 through the conductive coupler 55, the prober controller 34 effectuates movement of the conductive coupler 46 from one padset to another padset.

As stated supra, there are N pads on each of M padsets on the wafer 14, and the present invention automates testing of the ESD devices which are electrically coupled to the N×M pads. The automation includes having computer system 36, and the computer code 67 therein (see FIG. 4), manage and control: 1) a sequential order of testing the ESD devices; and 2) a sequence of operations or steps for testing each ESD device, as described infra in conjunction with FIG. 3.

As to the sequential order of testing the ESD devices, the ESD devices may be tested in any order, and two particular embodiments for the order of ESD device testing are presented as examples. Let the M padsets be denoted as $S_1$, $S_2$, ..., $S_M$.

The first embodiment for the order of ESD device testing is: testing all ESD devices in the padset $S_1$, followed by testing all ESD devices in the padset $S_2$, ..., followed by testing all ESD devices in the padset $S_M$. For a padset in which the number of ESD devices to be tested is K, and such ESD devices are denoted as $E_1$, $E_2$, ..., $E_K$, the first embodiment includes sequentially testing the ESD devices $E_1$, $E_2$, ..., $E_K$. Implementation by the computer code 67 (see FIG. 4) of the computer system 36 utilizes the switching matrix 30 and the ground board 16 for: enabling $E_1$, testing $E_1$, disabling $E_1$, enabling $E_2$, testing $E_2$, disabling $E_2$, ..., enabling $E_K$, testing $E_K$, and disabling $E_K$.

The preceding first embodiment may also include making a transition between two different padsets; e.g., testing the last ESD device $E_K$ in a first padset followed by testing the first ESD device E1 in a second padset. Implementation by the computer code 67 (see FIG. 4) of the computer system 36 utilizes the switching matrix 30 and the ground board 16 for: enabling $E_K$ of the first padset, testing $E_K$ of the first padset, disabling $E_K$ of the first padset, moving by the prober controller 34 the conductive coupler 46 from the first padset to the second padset, enabling $E_1$ of the second padset, testing $E_1$ of the second padset, and disabling $E_1$ of the second padset.

Alternatively, the preceding first embodiment may have exactly one padset (i.e., M=1). If M=1, then the prober controller 34 is not needed, since the conductive needles of the conductive coupler 46 (see FIG. 2 for conductive needles 101–105 at ends of conductive wires 91–95, respectively) would not have to be moved from one padset to another padset.

The second embodiment for the order of ESD device testing is illustrated by the following example. Let the ESD devices which are electrically coupled to a given padset be viewed as a subset of ESD devices for the given padset. For illustrative purposes only, assume that each padset has pads which are electrically coupled to two types of ESD devices: resistors and MOFSETs. Let the resistors in each padset be considered as a first subset of electronic devices in each padset, and let the MOFSETs in each padset be considered as a second subset of electronic devices in each padset. Then the order of ESD device testing is: enabling, testing, and disabling each resistor in the padset $S_1$, followed by enabling, testing, and disabling each resistor in the padset $S_2$, ..., followed by enabling, testing, and disabling each resistor in the padset $S_M$, followed by enabling, testing, and disabling each MOFSET in the padset $S_1$, followed by enabling, testing, and disabling each MOFSET in the padset $S_2$, ..., followed by enabling, testing, and disabling each MOFSET in the padset $S_M$.

Generally, the second embodiment for the order of ESD device testing is: enabling, testing, and disabling a first subset of ESD devices in the padset $S_1$, followed by enabling, testing, and disabling the first subset of ESD devices in the padset $S_2$, ..., followed by enabling, testing, and disabling the first subset of ESD devices in the padset $S_M$, followed by enabling, testing, and disabling a second subset of ESD devices in the padset $S_1$, followed by enabling, testing, and disabling the second subset of ESD devices in the padset $S_1$ in the padset $S_2$, followed by enabling, testing, and disabling the second subset of ESD devices in the padset $S_M$, followed by testing a second subset of ESD devices in the padset $S_M$, ..., followed by testing in a similar fashion remaining subsets of ESD devices in the padsets $S_1$, $S_2$, ..., $S_M$.

The preceding second embodiment includes making a transition between two different padsets; e.g., testing an ESD device in a first padset followed by testing an ESD device in a second padset. Hardware implementation for making the transition between any two different padsets utilizes the prober controller 34 function under program control of the computer code 67 of the computer system 36 (see FIG. 4 for the computer code 67) as discussed supra.

While the first embodiment and the second embodiment for ordering testing of the ESD devices are presented herein, any other ordering is within the scope of the present invention. Any other such ordering is implemented in hardware by the switching matrix 30, the ground board 18, and the prober controller 34 in a manner similar to the aforementioned use of the switching matrix 30, the ground board 18, and the prober controller 34 for the first embodiment and the second embodiment. Any other such ordering is under program control of the computer code 67 (see FIG. 4) of the computer system 36. A prescription for sequentially ordering testing of the ESD devices is called an "ordering prescription." An ordering prescription includes a list of ESD devices in an order of the testing of the ESD devices, or equivalent data thereof. Both the first embodiment and the second embodiment for ordering testing of the ESD devices, as presented herein, include ordering prescriptions. Since the computer system 36 manages the ordering of testing of the ESD devices, the computer system 36 must have knowledge of the ordering prescription. Thus, the computer system 36 includes, or has access to, data files, data tables (e.g., spreadsheets), or like data arrangements, which include ordering. Alternatively, an ordering prescription may be generated by user input such as, inter alia, input obtained by the user's response to prompts by the computer code for information from which the ordering prescription could be generated. See FIG. 4 for ordering prescriptions 68 in the computer system 36.

Figure 3:
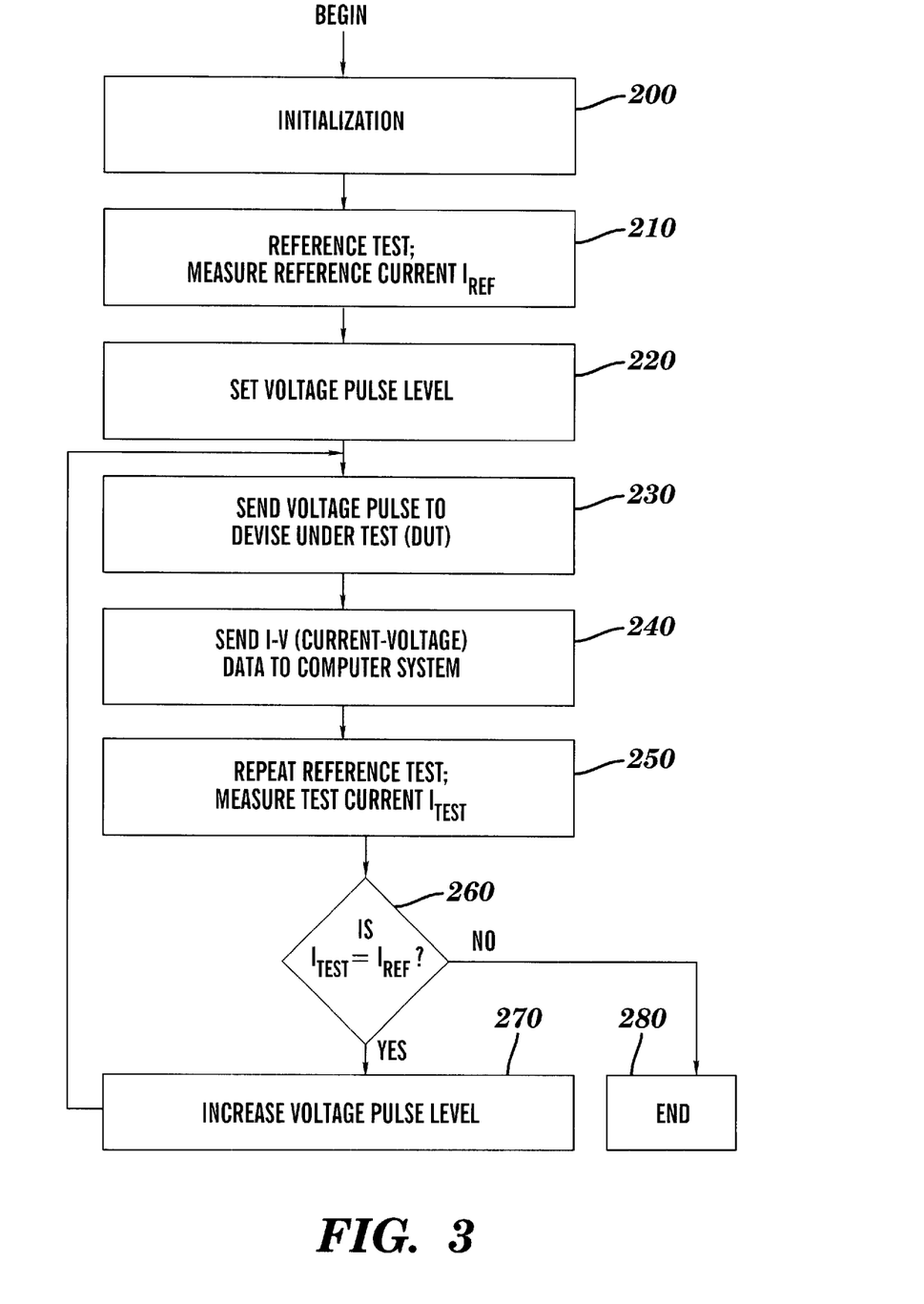
FIG. 3 is a flow chart that illustrates a sequence of operations or steps for testing each ESD device which led to a padset of FIG. 2.

FIG. 3 is a flow chart which illustrates a sequence of steps for testing each ESD device. The sequence of steps is triggered or otherwise controlled by the computer system 36 and the computer code 67 therein (see FIG. 4 for the computer code 67). See the discussion supra as to how each device of the ATLP testing system of FIGS. 1 and 2 is controlled by the computer system 36. An ESD device being tested is called a "Device Under Test" (DUT).

Recalling that N is the number of pads in each padset, the testing for the DUT begins with initialization 200, comprising: enabling the DUT, resetting equipment,. and setting switches (or relays) within the voltage probe board 18 to select the DUT. Enabling the DUT includes aligning and conductively contacting the N conductive needles with the N conductive pads of the padset 70 of the wafer 14 (see FIG. 2, which shows the conductive needles 101–105 contacting the conductive pads 71–75, respectively, for the case of N=5). If the N conductive needles are already properly aligned and positioned from the immediately preceding DUT, then the alignment and positioning is not necessary. Enabling the DUT also effectuates a subsequent detecting of voltage levels by the ground board 16 in grounded circuit paths of the DUT and sends to the oscilloscope 22 the grounded voltage values so detected.

Resetting equipment means resetting the devices shown in FIG. 1 to an initial state as necessary for testing the DUT. Setting switches within the voltage probe board 18 effectuates a subsequent detecting of voltage levels at the DUT and sending to the oscilloscope 22 the DUT voltage levels so detected.

After the initialization 200, a reference test is conducted in accordance with step 210. The reference test passes a DC reference voltage $V_{REF}$ from the DC Leakage Measurement Unit 33 to the DUT by way of the switching matrix 30. $V_{REF}$ should be low enough to ensure that the DUT will not fail during this reference test. The DC Leakage Measurement Unit 33 measures a reference DC current $I_{REF}$ associated with $V_{REF}$ and transmits $I_{REF}$ to the oscilloscope 22 through the conductive coupler 57. The oscilloscope 22 passes $I_{REF}$ to the computer system 36 through the conductive coupler 51. This reference test will be repeated subsequently in step 250 to determine whether the DUT failed as a consequence of the step 230, as will be discussed infra.

In step 220, a voltage pulse level is set. Step 230 sends the voltage pulse at the voltage pulse level from the pulse generator 32 to the DUT by way of the switching matrix 30. The voltage pulse travels to the switching matrix 30 after passing through the current probe 38 which measures and sends electrical current values to the oscilloscope 22. The voltage pulse also passes through the ground board 16 and voltage probe board 18 en route to the DUT. The ground board 16 sends ground voltage values to the oscilloscope 22. The voltage probe 18 sends voltage levels at the DUT to the oscilloscope 22. The step 240 sends to the computer system 36 the current-voltage data so received by the oscilloscope 22. The computer system 36 may save, display, or otherwise utilize the current-voltage data so received from the oscilloscope 22.

A determination is next made in step 250 as to whether the last voltage pulse sent to the DUT in step 230 caused the DUT to fail. The step 250 repeats the reference test of step 210 by passing the DC reference voltage $V_{REF}$ from the DC Leakage Measurement Unit 33 to the DUT by way of the switching matrix 30. The DC Leakage Measurement Unit 33 measures a test DC current $I_{TEST}$ associated with $V_{REF}$ and transmits $I_{TEST}$ to the oscilloscope 22 through the conductive coupler 57. Then step 260 compares $I_{TEST}$ with $I_{REF}$. If TEST equals $I_{REF}$ then the last voltage pulse did not cause the DUT to fail. $I_{TEST}$ is considered as equal to IREF if $I_{TEST}$ is within a tolerance $\Delta I$ of $I_{REF}$, wherein $\Delta I$ is an predetermined percent Of $I_{REF}$. The predetermined percent of $I_{REF}$ is application-dependent and is typically user specified. If $I_{TEST}$ is unequal to $I_{REF}$, then the last voltage pulse caused the DUT to fail and testing for the DUT has ended in step 280. If $I_{TEST}$ equals $I_{REF}$, then the voltage pulse level is increased in step 270, and steps 230, 240, 250, 260, and 270 are repeated iteratively until the DUT fails. After the DUT fails (i.e., when testing of the DUT ends in step 280), the next DUT in the testing sequence is tested in accordance with the procedure of FIG. 3 beginning with the initialization step 200.

Although the sequence of steps for testing the DUT has been presented herein in a particular manner, any modification of this sequence, as would be apparent to one of ordinary skill in the art, is within the scope of the present invention. Said any modification includes a modification or a resequencing of a process within a step such as the processes stated herein for the initialization step 200. Additionally, a process within a given step of FIG. 3 may be moved to another step of FIG. 3, as would be apparent to one of ordinary skill in the art.

Figure 4:
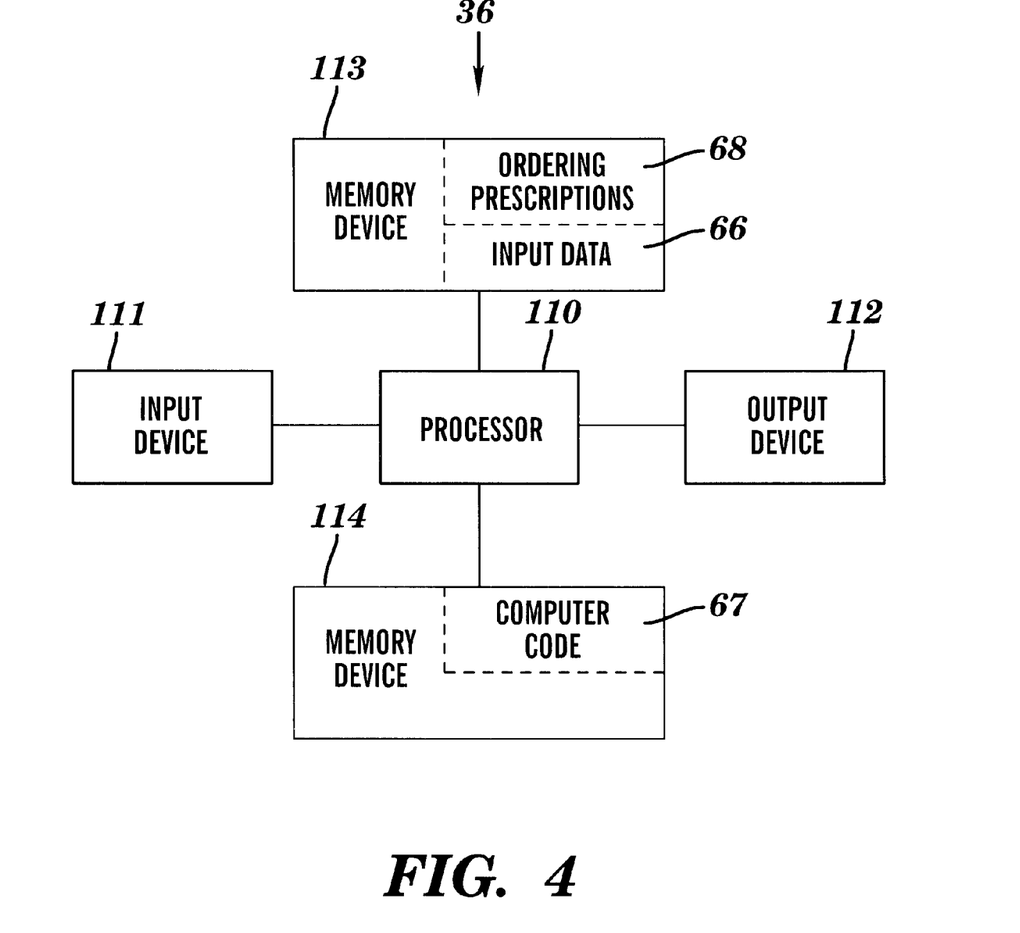
FIG. 4 the computer system of FIG. 1.

FIG. 4 illustrates the computer system 36 of FIG. 1. The computer system 36 comprises a processor 110, an input device 111 coupled to the processor 110, an output device 112 coupled to the processor 110, and memory devices 113 and 114 each coupled to the processor 110. The input device 111 may be, inter alia, a keyboard, a mouse, etc. The output device 112 may be, inter alia, a printer, a plotter, a computer screen, a magnetic tape, a removable hard disk, a floppy disk, etc. The memory devices 113 and 114 may be, inter alia, a hard disk, a dynamic random access memory (DRAM), a read-only memory (ROM), etc. The memory device 114 includes a computer code 67. The computer code 67 includes an algorithm for implementing ATLP testing of ESD devices as described herein. The processor 110 executes the computer code 67. The memory device 113 includes input data 66 and at least one ordering prescription 68 (i.e., one or more prescriptions for ordering the testing of the ESD devices, as described supra). The at least one ordering prescription 68 may alternatively be included within the memory device 113, or within both memory devices 113 and 114. The input data 66 includes input required by the computer code 67. The output device 112 displays output (such as current vs. voltage curves for the ESD devices tested) from the computer code 67.

While FIG. 4 shows the computer system 36 as a particular configuration of hardware and software, any configuration of hardware and software, as would be known to a person of ordinary skill in the art, may be utilized for the purposes stated supra in conjunction with the particular computer system 36 of FIG. 4. For example, the memory devices 113 and 114 may be portions of a single memory device rather than separate memory devices. As another example, the ordering prescriptions, which are shown in the memory device 113, may alternatively be in the memory device 114 as a file, table, etc., or hard-wired explicitly within the computer code 67.

While embodiments of the present invention have been described herein for purposes of illustration, many modifications and changes will become apparent to those skilled in the art.

Accordingly, the appended claims are intended to encompass all such modifications and changes as fall within the true spirit and scope of this invention.

We claim:

1. An apparatus for testing a plurality of electrostatic discharge (ESD) devices on a wafer, comprising: a computer system; a pulse generator; a current probe; a switching matrix; an oscilloscope; a ground board; a voltage probe board; and N circuit paths originating from the switching matrix and passing through both the ground board and the voltage probe board, wherein N is at least 2,
wherein the computer system is electrically coupled to electrical devices including: the pulse generator, the current probe, the switching matrix, the oscilloscope, the ground board, and the voltage probe board,
wherein the computer system, upon execution of a computer code, serves to control and synchronize operation of the electrical devices, wherein, under program control of the computer system, the pulse generator serves to generate a voltage pulse and to send the voltage pulse to the switching matrix by way of the current probe, wherein, under program control of the computer system, the current probe serves to detect an electrical current value associated with the voltage pulse and to transmit the electrical current value to the oscilloscope, wherein, under program control of the computer system, the switching matrix serves to electrically connect Z circuit paths of the N circuit paths to the pulse generator, such that Z is at least 1, wherein, under program control of the computer system, the ground board serves to electrically disconnect X circuit paths of the Z circuit paths from the pulse generator and to connect the X circuit paths to a ground voltage level, wherein, under program control of the computer system and if X is less than Z, the voltage probe board serves to detect voltage values in a remaining Z-X circuit paths and to pass the voltage values to the oscilloscope, such that the remaining Z-X circuit paths of the Z circuit paths are not among the X circuit paths, and wherein the oscilloscope, under program control of the computer system, serves to receive the voltage values and the electrical current value and to pass the voltage values and the electrical current value to computer system.

2. The apparatus of claim 1, wherein the ground board and the voltage probe board are separated from each other by no more than about six inches.

3. The apparatus of claim 1, wherein the ground board is electrically interposed between the switching matrix and the voltage probe board.

4. The apparatus of claim 1, further comprising a direct current (DC) leakage measurement unit, wherein the computer system is electrically coupled to the DC leakage measurement unit, wherein the computer system, upon execution of the computer code, further serves to control and synchronize operation of the DC leakage measurement unit in conjunction with operation and control of the electrical devices, wherein the DC leakage measurement unit, under program control of the computer system, serves to generate a DC voltage, to send the DC voltage to the switching matrix, to determine a DC electrical current value associated with the DC voltage, and to transmit to the oscilloscope a value of the DC voltage and the DC electrical current value, and wherein the oscilloscope further serves to receive the value of the DC voltage and the DC electrical current value, and to pass the value of the DC voltage and the DC electrical current value to the computer system.

5. The apparatus of claim 1, further comprising the wafer, wherein the wafer has M padsets and N conductive pads on each padset, wherein M is at least 2, wherein each ESD device is conductively coupled to a unique plurality of pads of a padset of the M padsets, and wherein the N circuit paths terminate in N conductive needles which respectively contact electrically the N conductive pads of a first padset of the M padsets.

6. The apparatus of claim 5, further comprising a prober controller, wherein the computer system is electrically coupled to the prober controller, wherein the computer system, upon execution of the computer code, further serves to control and synchronize operation of the prober controller in conjunction with operation and control of the electrical devices, and wherein the prober controller, under program control of the computer system, serves to move the N conductive needles away from the first padset of the M padsets to a second padset of the M padsets such that the N conductive needles respectively contact electrically the N conductive pads of the second padset.

7. The apparatus of claim 1, further comprising the wafer, wherein the wafer has M padsets and N conductive pads on each padset, wherein M is at least 1, and wherein each ESD device is conductively coupled to a unique plurality of pads of a padset of the M padsets.

8. The apparatus of claim 7, wherein the voltage probe board and the ground board are each positioned no more than about 6 inches from the wafer.

9. The apparatus of claim 7, wherein the Z circuit paths terminate at Z conductive pads of a first padset of the M padsets, and wherein an ESD device of the ESD devices is electrically coupled to the Z pads.

10. The apparatus of claim 7, wherein the wafer includes an integrated circuit or a module.

11. An electronic structure utilized for enhancing an accuracy of voltage determinations made during testing of a plurality of electrostatic discharge (ESD) devices on a wafer, comprising:

the wafer having M padsets and N conductive pads on each padset, wherein M is at least 1, wherein N is at least 2, and wherein each ESD device is conductively coupled to a unique plurality of pads of a padset of the M padsets;

N circuit paths electrically coupled to the N conductive pads of a first padset of the M padsets; and an electrical device structure comprising a ground board in series with a voltage probe board, wherein the N circuit paths are electrically coupled to both the ground board and the voltage probe board, and wherein the voltage probe board and the ground board are each positioned no more than about 6 inches from the wafer.

12. The electronic structure of claim 11, wherein the ground board and the voltage probe board are separated from each other by no more than about six inches.

13. The electronic structure of claim 11, wherein the N circuit paths terminate in N conductive needles which respectively contact electrically the N conductive pads of the first padset of the M padsets, and further comprising a prober controller which serves to move the N conductive needles away from the first padset of the M padsets to a second padset of the M padsets such that the N conductive needles respectively contact electrically the N conductive pads of the second padset.

14. The electronic structure of claim 11, wherein the N circuit paths terminate in N conductive needles which respectively contact electrically the N conductive pads of the first padset of the M padsets, and further comprising a computer system and a prober controller, wherein the prober controller, under program control of the computer system, serves to move the N conductive needles away from the first padset of the M padsets to a second padset of the M padsets such that the N conductive needles respectively contact electrically the N conductive pads of the second padset.

15. A method for testing a plurality of electrostatic discharge (ESD) devices on a wafer, comprising the steps of:

providing an apparatus comprising: computer system; a pulse generator; a current probe; a switching matrix; an oscilloscope; a ground board; a voltage probe board; and N circuit paths originating from the switching matrix and passing through both the ground board and the voltage probe board, wherein N is at least 2, wherein the computer system is electrically coupled to electrical devices including: the pulse generator, the current probe, the switching matrix, the oscilloscope, the ground board, and the voltage probe board;

controlling and synchronizing, by the computer system upon execution of a computer code, operation of the electrical devices;

generating by the pulse generator, under program control of the computer system, a voltage pulse;

sending by the pulse generator, under program control of the computer system, the voltage pulse to the switching matrix by way of the current probe;

detecting by the current probe, under program control of the computer system, an electrical current value associated with the voltage pulse;

transmitting by the current probe, under program control of the computer system, the electrical current value to the oscilloscope;

electrically connecting by the switching matrix, under program control of the computer system, Z circuit paths of the N circuit paths to the pulse generator, such that Z is at least 1;

electrically disconnecting by the ground board, under program control of the computer system, X circuit paths of the Z circuit paths from the pulse generator;

connecting by the ground board, under program control of the computer system, the X circuit paths to a ground voltage level;

if X is less than Z, detecting voltage values by the voltage probe board, under program control of the computer system, a remaining Z-X circuit paths, such that the remaining Z-X circuit paths of the Z circuit paths are not among the X circuit paths;

passing by the voltage probe board, under program control of the computer system, the voltage values to the oscilloscope;

receiving by the oscilloscope, under program control of the computer system, the voltage values and the electrical current value; and passing by the oscilloscope, under program control of the computer system, the voltage values and the electrical current value to computer system.

16. The method of claim 15, wherein the ground board and the voltage probe board are separated from each other by no more than about six inches.

17. The method of claim 15, wherein the ground board is electrically interposed between the switching matrix and the voltage probe board.

18. The method of claim 15, further comprising:

providing a direct current (DC) leakage measurement unit, wherein the computer system is electrically coupled to the DC leakage measurement unit, controlling and synchronizing, by the computer system upon execution of a computer code, operation of the DC leakage measurement unit in conjunction with the operation and control of the electrical devices;

generating by the DC leakage measurement unit, under program control of the computer system, a DC voltage;

sending by the DC leakage measurement unit, under program control of the computer system, the DC voltage to the switching matrix;

determining by the DC leakage measurement unit, under program control of the computer system, a DC electrical current value associated with the DC voltage;

transmitting by the DC leakage measurement unit, under program control of the computer system, to the oscilloscope a value of the DC voltage and the DC electrical current value; and receiving by the oscilloscope, under program control of the computer system, the value of the DC voltage; and passing by the oscilloscope, under program control of the computer system, the value of the DC voltage and the DC electrical current value to the computer system.

19. The method of claim 15, further comprising providing the wafer, wherein the wafer has M padsets and N conductive pads on each padset, wherein M is at least 2, wherein each ESD device is conductively coupled to a unique plurality of pads of a padset of the M padsets, and wherein the N circuit paths terminate in N conductive needles which respectively contact electrically the N conductive pads of a first padset of the M padsets.

20. The method of claim 19, further comprising:

providing a prober controller, wherein the computer system is electrically coupled to the prober controller;

controlling and synchronizing, by the computer system upon execution of a computer code, operation of the prober controller in conjunction with operation and control of the electrical devices; and moving by the prober controller, under program control of the computer system, the N conductive needles away from the first padset of the M padsets to a second padset of the M padsets such that the N conductive needles respectively contact electrically the N conductive pads of the second padset.

21. The method of claim 15, further comprising providing the wafer, wherein the wafer has M padsets and N conductive pads on each padset, wherein M is at least 1, and wherein each ESD device is conductively coupled to a unique plurality of pads of a padset of the M padsets.

22. The method of claim 21, wherein the voltage probe board and the ground board are each positioned no more than about 6 inches from the wafer.

23. The method of claim 21, wherein the Z circuit paths terminate at Z conductive pads of a first padset of the M padsets, and wherein an ESD device of the ESD devices is electrically coupled to the Z pads.

24. The method of claim 21, wherein the wafer includes an integrated circuit or a module.

25. A method for testing a plurality of electrostatic discharge (ESD) devices on a wafer, comprising the steps of:

providing the wafer having M padsets and N conductive pads on each padset, wherein M is at least 1, wherein N is at least 2, and wherein each ESD device is conductively coupled to a unique plurality of pads of a padset of the M padsets;

providing a computer system;

denoting the plurality of ESD devices as $E_1, E_2, \ldots, E_I$, wherein I denotes the number of said ESD devices;

sequencing, under program control of the computer system, the testing of the ESD devices $E_1, E_2, \ldots, E_I$, wherein the testing of each ESD device of the ESD devices $E_1, E_2, \ldots, E_I$ is under program control of the computer system.

26. The method of claim 25, wherein the sequencing step comprises:

denoting the M padsets as $S_1, S_2, \ldots, S_M$; and processing by looping from i=1 to i=I in increments of 1, wherein for each i the processing includes sequentially testing all ESD devices which are conductively coupled to pads of the padset $S_i$.

27. The method of claim 25, wherein the sequencing step comprises:

denoting the M padsets as $S_1, S_2, \ldots, S_M$;

first processing by looping from i=1 to i=I in increments of 1, wherein for each i the first processing includes sequentially testing a first subset of ESD devices which are conductively coupled to first pads of the padset $S_i$; and second processing by looping from i=1 to i=I in increments of 1, wherein for each i the second processing includes sequentially testing a second subset of ESD devices which are conductively coupled to second pads of the padset $S_i$.

28. The method of claim 25, wherein the testing of each ESD device comprises:

performing a reference test, including: passing a direct current (DC) voltage to the ESD device, and measuring a first total DC electrical current ($I_{REF}$) associated with the DC voltage;

setting a voltage pulse level;

transmitting a voltage pulse at the voltage pulse level to the ESD device;

repeating the reference test, including: passing the DC voltage to the ESD device, and measuring a second DC electrical current ($I_{TEST}$) associated with the DC voltage so passed;

determining whether $I_{TEST}$ is within a predetermined percent of $I_{REF}$;

if $I_{TEST}$ is within the predetermined percent of $I_{REF}$, then increasing the voltage pulse level and again executing the transmitting, repeating, and determining steps, else ending the testing of the ESD device.

29. A method for enhancing an accuracy of voltage determinations made during testing of a plurality of electrostatic discharge (ESD) devices on a wafer, comprising the steps of:

providing the wafer having M padsets and N conductive pads on each padset, wherein M is at least 1, wherein N is at least 2, and wherein each ESD device is conductively coupled to a unique plurality of pads of a padset of the M padsets;

providing N circuit paths electrically coupled to the N conductive pads of a first padset of the M padsets;

providing an electrical device structure comprising a ground board in series with a voltage probe board;

positioning the voltage probe board and the ground board such that the voltage probe board and the ground board are each positioned no more than about 6 inches from the wafer; and electrically coupling the N circuit paths to both the ground board and the voltage probe board.

30. The method of claim 29, further comprising separating the ground board from the voltage probe board no more than about six inches.

31. The method of claim 29, wherein the N circuit paths terminate in N conductive needles which respectively contact electrically the N conductive pads of the first padset of the M padsets, and further comprising:

providing a prober controller; and moving by the prober controller the N conductive needles away from the first padset of the M padsets to a second padset of the M padsets such that the N conductive needles respectively contact electrically the N conductive pads of the second padset.

32. The method of claim 31, further comprising providing a computer system, wherein the moving step is executed under program control of the computer system.

33. A computer system for testing a plurality of electrostatic discharge (ESD) devices on a wafer, comprising:

a processor;

an input device coupled to the processor;

an output device coupled to the processor;

a first memory device coupled to the processor;

a computer code stored in the first memory device, wherein the processor executes the computer code, wherein the computer code comprises an algorithm which controls the testing of the plurality of ESD devices in the wafer, and wherein the algorithm implements an Automated Transmission Line Pulse (ATLP) testing of the ESD devices, wherein the algorithm implements the testing of the ESD devices in accordance with an ordering prescription, and wherein the ordering prescreiption includes data selected from the group consisting of a list of the ESD devices in an order of the testing of the EDS devices and epuivalent data thereof.

34. The computer code of claim 33, wherein the ordering prescription is included within a memory structure selected from the group consisting a second memory device coupled to the processor, the first memory device, and a combination thereof.

35. The computer code of claim 33, wherein the algorithm generates the ordering prescription from user input.

36. The computer code of claim 35, wherein the user input is obtained by a user's response to prompts by the computer code for information from which the ordering prescription could be generated.

37. An apparatus for testing a multiplicity of electrostatic discharge (ESD) devices on a wafer, said apparatus comprising:

a voltage probe board and a ground board, each comprising a multiplicity of conductive wires that electrically couple the voltage probe board and the ground board to a pulse generator and a current probe; and a multiplicity of movable conductive needles electrically connected to said conductive wires to connect said pulse generator, said current probe, and said voltage probe board to each of said multiplicity of ESD devices to apply a voltage pulse to and measure a resultant current through and a voltage across a connected ESD device of the connected ESD devices.

38. An apparatus as set forth in claim 37, wherein said voltage probe board comprises a multiplicity of switches to select the connected ESD device.

39. An apparatus as set forth in claim 37, wherein said voltage probe board is within six inches of the connected ESD device.

40. An apparatus as set forth in claim 37, wherein said ground board comprises a multiplicity of switches to connect one or more terminals of the connected ESD device to a ground plane.

41. An apparatus as set forth in claim 37, wherein said ground plane is within six inches of the connected ESD device.

42. An apparatus as set forth in claim 37, further comprising a Faraday box which encloses said wafer, said movable conductive needles, said voltage probe board, and said conductive wires.

43. An apparatus as set forth in claim 37, wherein said conductive needles comprise at least one wire per ESD device.

* * * * *